United States Patent
Mark et al.

(10) Patent No.: US 7,262,623 B1
(45) Date of Patent: *Aug. 28, 2007

(54) METHOD FOR GROSS I/O FUNCTIONAL TEST AT WAFER SORT

(75) Inventors: David Mark, San Jose, CA (US); Yung-Cheng Chen, San Jose, CA (US); Randy J. Simmons, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 400 days.

This patent is subject to a terminal disclaimer.

(21) Appl. No.: 10/619,136

(22) Filed: Jul. 14, 2003

Related U.S. Application Data

(63) Continuation-in-part of application No. 10/355,563, filed on Jan. 31, 2003, now Pat. No. 6,788,095.

(51) Int. Cl.
*G01R 31/26* (2006.01)
(52) U.S. Cl. .................................................... 324/765
(58) Field of Classification Search ............... 324/765, 324/754, 158.1, 755, 73.1, 72.5, 758, 761, 324/769; 365/201; 438/14, 17, 18; 257/48
See application file for complete search history.

(56) References Cited

U.S. PATENT DOCUMENTS

| | | | |
|---|---|---|---|
| 5,198,707 A * | 3/1993 | Nicolai .................. | 326/98 |
| 6,069,515 A * | 5/2000 | Singh ..................... | 327/309 |
| 6,262,585 B1 * | 7/2001 | Frodsham et al. ........ | 324/763 |
| 6,285,609 B1 * | 9/2001 | Fister ..................... | 365/201 |
| 6,313,656 B1 * | 11/2001 | Schaffroth et al. ....... | 324/763 |
| 6,348,810 B1 * | 2/2002 | Yanagawa et al. ........ | 324/765 |
| 6,717,429 B2 * | 4/2004 | Whetsel .................. | 324/765 |
| 6,788,095 B1 * | 9/2004 | Mark et al. ............. | 324/765 |
| 6,894,308 B2 * | 5/2005 | Whetsel et al. .......... | 257/48 |
| 6,963,212 B2 * | 11/2005 | Brown ................... | 324/763 |
| 2002/0070744 A1 * | 6/2002 | Linn ..................... | 324/763 |
| 2005/0212542 A1 * | 9/2005 | Brown ................... | 324/763 |

OTHER PUBLICATIONS

U.S. Appl. No. 10/355,563, filed Jan. 31, 2003, Mark et al.

* cited by examiner

*Primary Examiner*—Jermele Hollington
(74) *Attorney, Agent, or Firm*—Justin Liu

(57) ABSTRACT

A method and test configuration for performing a gross I/O functionality test at wafer sort is described. The method uses a current injector, such as a pullup or a pulldown on an I/O pad, to inject current at the I/O pad, and based on the resulting voltage, determines if the I/O characteristics of the IC meet the performance criteria set by a manufacturer. In some embodiments, the test configuration can comprise an output buffer, which can be a tristate buffer, and/or an input buffer for verifying the performance of those components. The method and test configuration allow such tests to be performed at wafer sort without a precision measurement unit and without direct access to the I/O pad to be tested.

26 Claims, 6 Drawing Sheets

METHOD FOR GROSS I/O FUNCTIONAL TEST AT WAFER SORT

CROSS-REFERENCE TO RELATED APPLICATIONS

This application is a continuation-in-part application of commonly assigned, U.S. patent application Ser. No. 10/355,563, entitled "Method for Gross Input Leakage Functional Test at Wafer Sort," by David Mark and Randy J. Simmons, and filed Jan. 31, 2003 now U.S. Pat. No. 6,788,095, which is incorporated herein by reference in its entirety.

FIELD OF THE INVENTION

The invention relates to semiconductor testing, and more particularly, to a method for wafer sort testing.

BACKGROUND OF THE INVENTION

Integrated circuits (ICs) are tested and characterized at different points during the manufacturing process by which they are fabricated and assembled, and ultimately shipped to customers. The test and characterization data can be used to grade the performance of the ICs, and to eliminate ICs that fail to meet performance standards set by a manufacturer. The manufacturer can specify minimum requirements for functionality of the IC, and for speed, power, voltage, current, and any other performance-related parameters. ICs that fail to meet any or all of such requirements can be eliminated.

One set of tests is performed at "wafer sort." At this point, the ICs are fully formed, but have not yet been "diced," or separated into individual chips. ICs are typically produced on silicon wafers, each wafer having many ICs. During wafer sort, a probe card is used to provide test signals to the IC and receive test results from the IC. The probe card touches down on certain input/output (I/O) bonding pads, and sends and receives signals through those contact points. The test results are analyzed, and the ICs that fail to meet the required performance standards can be discarded when the wafer is diced.

After the ICs are cut from the wafer and separated from each other, the ICs that failed the wafer sort test are eliminated, and the remaining ICs are assembled into their packages. The assembly process can involve, for example, attaching bond wires or solder bumps to the I/O bonding pads of the IC, connecting the IC to a substrate, and enclosing the IC in a protective package. Once assembly is complete, another set of tests, commonly referred to as "final test," is performed. At final test, automated test equipment (ATE) tests the performance of the fully assembled ICs, and as with the wafer sort test, ICs that fail to meet the performance standards set by a manufacturer are discarded.

One common parameter that is tested prior to shipping an IC to a customer is the input leakage current. Input leakage current refers to the static current drawn at an input. Normally, this measurement is made using a precision measurement unit (PMU). If any I/O on an IC shows input leakage current in excess of the maximum set by the manufacturer, the IC is discarded. For example, the Virtex™-II FPGA (field programmable gate array) manufactured by Xilinx®, Inc. of San Jose, Calif. has a maximum absolute value input leakage current of 10 μA, as specified on its data sheet, "Virtex™-II Platform FPGAs: DC and Switching Characteristics," Dec. 6, 2002, page 2, DS031-3 (v2.4) (the "Virtex-II Data Sheet"). Input leakage can be measured by connecting a PMU to an I/O pad of an IC, either at wafer sort or at final test. However, in order to make the current measurement, the PMU must have direct access to each I/O pad to be tested.

Other parameters that are commonly tested include $V_{OL}$, $V_{OH}$, $I_{OL}$, and $I_{OH}$, and other parameters typically specified on data sheets, and are often governed by requirements of the I/O standards an IC conforms to. $V_{OL}$ is the maximum voltage level that is permitted at an output for a logic low value, and is usually stated with respect to a given current load or logic standard. Similarly, $V_{OH}$ is the minimum voltage level permitted as a logic high. An IC adhering to many different logic and I/O standards can have many different specifications for $V_{OL}$ and $V_{OH}$. Similarly, $I_{OL}$ and $I_{OH}$ refer to the maximum current that an output must be able to source or sink when driving a logic low or a logic high, respectively. For example, Table 6 at pages 4-5 of the Virtex-II Data Sheet set forth $V_{OL}$, $V_{OH}$, $I_{OL}$, and $I_{OH}$ characteristics for the Virtex-II FPGA. These and other I/O parameters can also be tested by connecting a PMU to an I/O pad either at wafer sort or at final test. The PMU still requires direct access to each I/O pad to be tested in order to test such I/O parameters.

In some applications, however, the probe card used at wafer sort does not have access to every I/O pad of an IC. For example, the tests to be performed at wafer sort may only require access to a subset of the I/O pads. As another example, not all of the final, packaged ICs will make use of every I/O pad on the IC, so it can be more cost effective to touch down only on the common I/O pads that are used by every package configuration. In another example, a manufacturer can choose to run wafer sort tests only through certain I/O pads, since testing costs (such as the costs in aligning and maintaining probe cards) increase as the number of accessed I/O pads increases. However, if only certain I/O pads are accessed, the I/O pads that are not accessed by the tester cannot be tested by a PMU, and the leakage current and other I/O characteristics for those I/O pads cannot be determined.

In cases where not every I/O pad is tested at wafer sort, a manufacturer would test those I/O pads at final test. At final test, all of the I/O pads that are used by an IC in a particular package configuration are connected to package pins, and a manufacturer will typically test all such connected package pins to ensure complete functionality and performance. Testing performance at final test, however, increases the cost to the manufacturer, since the manufacturer still incurs the assembly costs for ICs that fail to meet the input leakage specification or other performance requirements at final test and are rejected and discarded. Had the IC been tested and rejected at the wafer sort test, the manufacturer could have saved at least the cost of assembly.

Therefore, a need exists for a cost-effective method for performing an I/O performance test, wherein such test can be performed early in the fabrication process, such as at wafer sort, and can be performed without having direct access to the I/O pads to be tested.

SUMMARY OF THE INVENTION

An IC in accordance with the present invention has an I/O pad, a current injector for injecting current at the I/O pad, and a detector. The current injector can be a resistive element coupled between a voltage reference node, usually power or ground. The detector can be used to detect a test result, such as by sensing a voltage level of the I/O pad. The test result can be retrieved through an interface such as JTAG. In some embodiments, the resistive element can be a transistor that can be selectively enabled by a memory bit. In some embodiments, the IC further comprises an output buffer, which can be a tristate buffer, and/or an input buffer.

A method in accordance with the present invention comprises enabling a current injector, measuring or detecting a resulting voltage level at the I/O pad by enabling a detector, and based on that result, determining if the I/O pad meets a predetermined performance threshold. If not, the IC can be rejected and discarded at the wafer sort test. In some embodiments, the current injector can be a resistive element coupled between an I/O pad and a voltage reference node, such as power or ground. In some embodiments, the method further comprises enabling an output buffer, which can be a tristate buffer, and/or an input buffer.

BRIEF DESCRIPTION OF THE DRAWINGS

The present invention is illustrated by way of example, and not by way of limitation, in the following figures, in which like reference numerals refer to similar elements.

DETAILED DESCRIPTION

The present invention is believed to be applicable to a variety of systems, and while the present invention is not so limited, an appreciation of the present invention is presented by way of specific examples. In the following description, numerous specific details are set forth to provide a more thorough understanding of the present invention. However, it will be apparent to one ordinarily skilled in the art that the present invention can be practiced without these specific details.

Figure 1A:
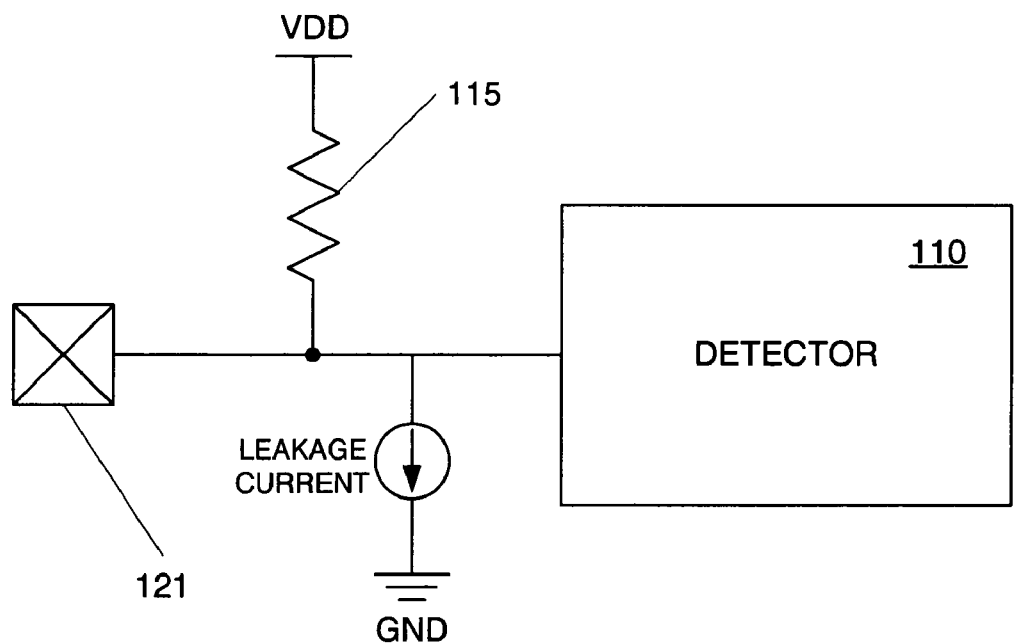
FIGS. 1A and 1B show block diagrams of test configurations for measuring leakage to ground and to power, respectively.

FIG. 1A shows a test configuration for measuring the input leakage at an I/O pad 121. I/O pad 121 is connected through a resistive element 115 to power node VDD. This configuration has the effect of injecting current at I/O pad 121. A detector 110 is also connected to I/O pad 121. Detector 110 can sense the resulting voltage level of I/O pad 121. As one of ordinary skill in the art will readily understand, the leakage current to ground can be determined based on the voltage drop across resistive element 115 and on a known relationship between that voltage drop and current for that resistive element. By placing the resistive element and the detector on the IC itself, there is no need for a precision measurement unit (PMU) to measure input leakage in this test configuration. This means, for instance, the automated test equipment (ATE) can test input leakage without direct access to each I/O pad to be tested.

Figure 1B:
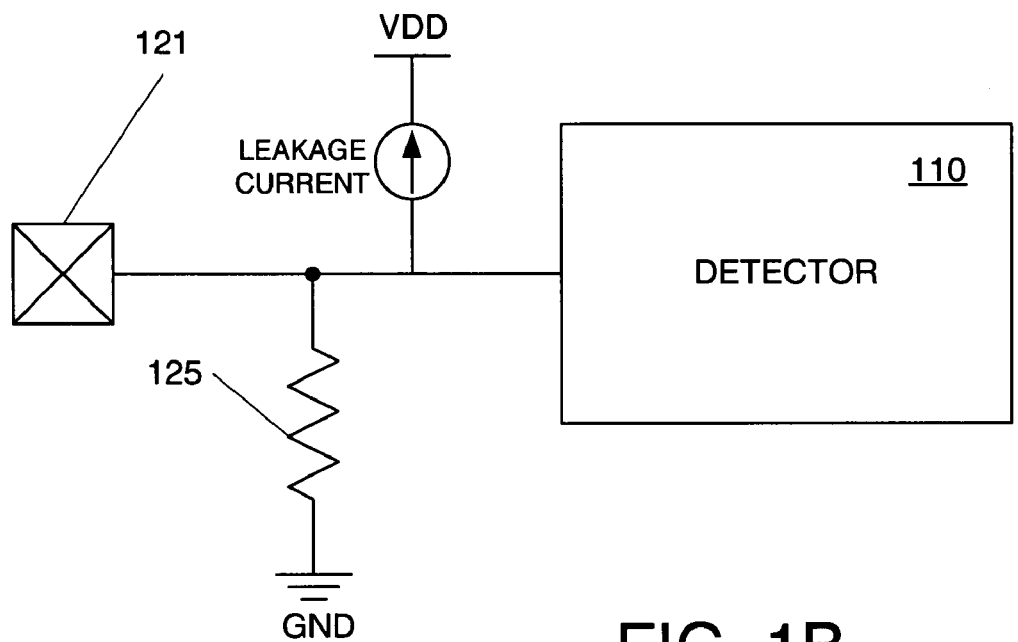

FIG. 1B shows a test configuration similar to the configuration shown in FIG. 1A. Here, a resistive element 125 is connected between I/O pad 121 and the ground node GND, and therefore allows the leakage current to the power node VDD to be determined. Again, detector 110 can measure the voltage level of I/O pad 121. Based on the measured voltage, the voltage drop across resistive element 125, and therefore the input leakage to VDD, can be determined.

Figure 2A:
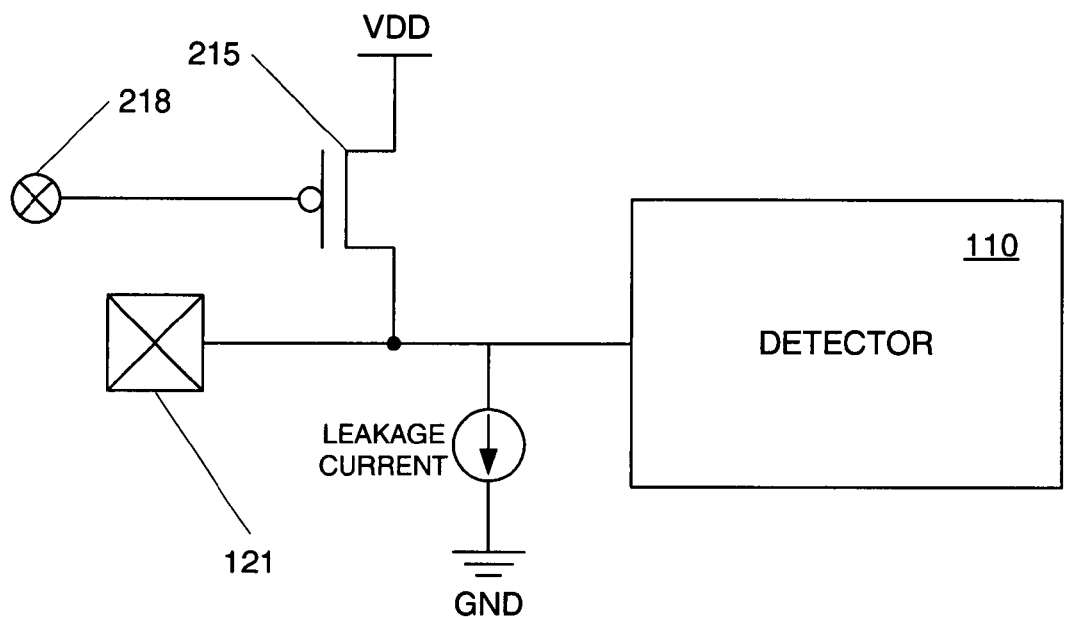
FIGS. 2A and 2B show block diagrams of test configurations for measuring leakage to ground and to power, respectively, using a transistor that can be controlled by a memory bit to produce a resistive element with a variable resistance.
Figure 2B:
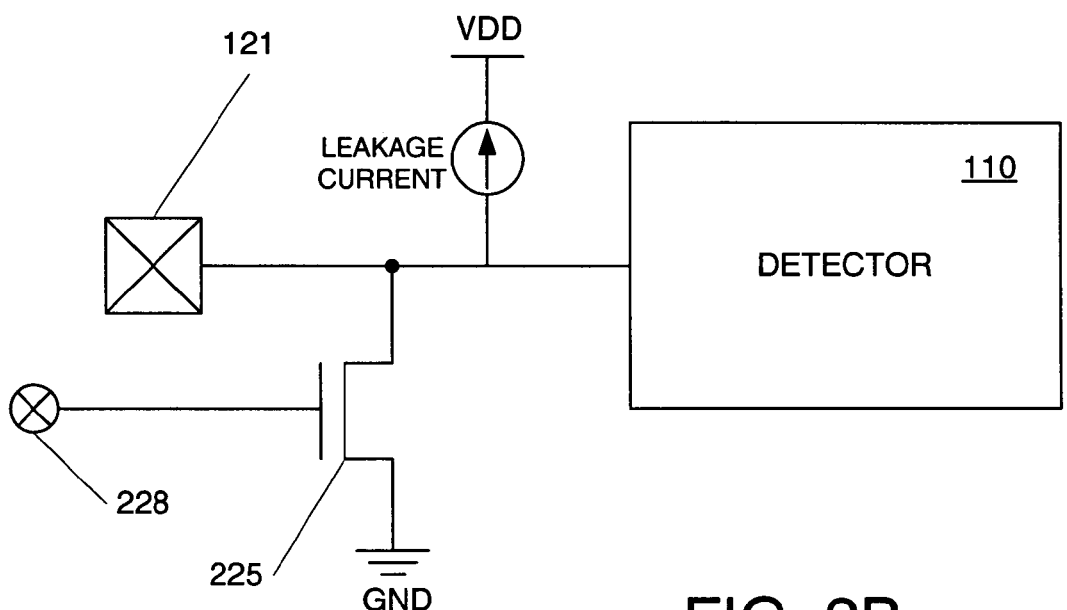

FIGS. 2A and 2B show embodiments of the present invention wherein the resistive elements are transistors. The test configuration shown in FIG. 2A has a transistor 215 connected between VDD and I/O pad 121. As before, the known relationship between the voltage drop across transistor 215 and the current flowing through transistor 215 allows for the leakage current to ground to be determined. In this example, a memory bit 218 is coupled to the gate of transistor 215, which allows for transistor 215 to be selectively enabled. For example, by appropriately configuring memory bit 218, transistor 215 can be enabled for determining the leakage current, and then later disabled for other applications. FIG. 2B shows a similar embodiment with a transistor 225 connected between I/O pad 121 and GND, and allowing for determination of the leakage to VDD. Like transistor 215, transistor 225 can also be selectively enabled by a memory bit 228. In other embodiments, transistors 215 and 225 can be selectively enabled by other circuitry or means (such as a zener diode), as will be known to those of ordinary skill in the art.

A programmable logic device (PLD) is a well-known type of integrated circuit that has various programmable resources and that can be programmed to perform specified logic functions. Types of PLDs include the field programmable gate array (FPGA) and the complex programmable logic device (CPLD). For all programmable logic devices, the functionality of the device is typically controlled by data bits provided to the device for that purpose. These data bits can be stored in volatile memory, non-volatile memory, or any other type of memory cell. Since PLDs already include programmable resources controlled by memory bits, a resistive element coupled between an I/O pad and a voltage reference node that is selectively enabled by a memory bit can be just another programmable resource controlled by memory bits in a PLD. This makes a resistive element particularly convenient to implement in a PLD. In fact, one PLD, the Virtex-II FPGA, for example, already includes a programmable pullup and pulldown in each I/O block that can be used as the resistive elements in the present invention. Many other PLDs also already incorporate the same or similar resources in their design. This means that for many PLDs, the present invention can be practiced without any significant additional circuitry.

In one embodiment, detector 110 can be a boundary scan cell. Boundary scan is part of the JTAG (Joint Test Access Group, also known as IEEE 1149.1) standard and is well known to those of ordinary skill in the art. A boundary scan cell includes a storage element, a serial input, and a serial output. The serial input and output are connected to other boundary scan cells on an IC to form a serial chain. SAMPLE/PRELOAD is a JTAG instruction that causes each boundary scan cell to "sample" and store the logical value of a particular node in an IC. This data can then be scanned out of the IC through the serial chain. Using an interface, such as JTAG, to retrieve the detected voltage levels means that an ATE only needs access to that interface, and not each I/O pad to be tested. This can result in a cost savings for a manufacturer, since the cost of testing increases as the number of I/O pads probed increases. For example, the JTAG interface only requires four I/O connections (not including power and ground) for access.

Figure 3:
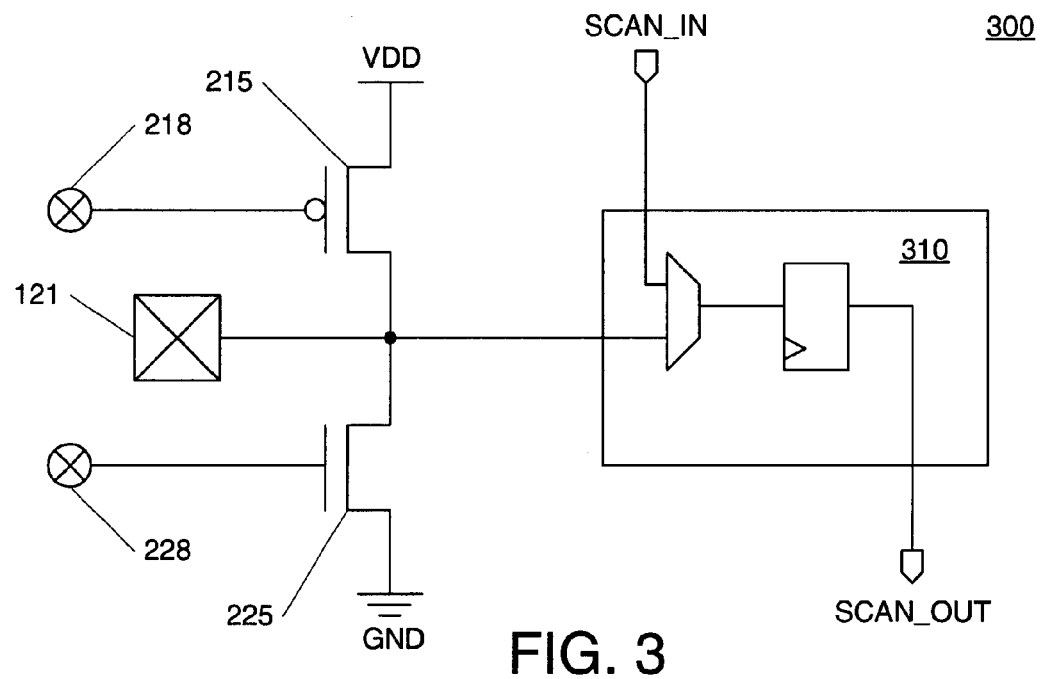
FIG. 3 shows a more detailed block diagram of a test configuration for measuring input leakage.

FIG. 3 shows a block diagram of a circuit 300 including a boundary scan cell 310. As represented in FIG. 3, boundary scan cell 310 includes a storage element that can (by, for example, using a multiplexer) store the value of a particular node (in this example, the value of I/O pad 121) and scan that value out through a serial output SCAN_OUT. Circuit 300 also incorporates both a transistor 215 (coupled between I/O pad 121 and VDD) and a transistor 225 (coupled between I/O pad 121 and GND), each of which can be independently and selectively enabled by appropriately configuring memory bits 218 and 228. For example transistors 215 and 225 can each be enabled in turn in order to test I/O pad 121 for leakage to GND and VDD, respectively.

When the JTAG controller issues the SAMPLE/PRELOAD instruction, a storage element of boundary scan cell 310 will store the logical value of I/O pad 121. If transistor 215 were enabled, a logic high would be expected at I/O pad 121 and would be stored by boundary scan cell 310. If, however, the value received and stored at boundary scan cell 310 is a logic low, then a minimum value for the leakage current to ground can be determined. Similarly, if transistor 225 were enabled, a logic low would be expected, and a logic high value at boundary scan cell 310 means that a minimum leakage current to VDD has been detected.

The minimum leakage current that can be detected can depend on the voltage and current relationships for transistors 215 and 225, the voltage level of the power supply VDD, and the "trip point" of the input to boundary scan cell 310. As used herein, "trip point" refers to the voltage level at which an input switches from a logic low to a logic high (or vice versa). The trip point for a particular input can be affected by the size of the transistors, the loading at the input, process variations, operational conditions, etc. In one embodiment, a minimum leakage current of approximately 100 µA can be detected by such an arrangement. For example, in the case where transistor 215 is enabled, if the leakage current to ground exceeds approximately 100 µA, boundary scan cell 310 detects a logic low (and not the expected logic high). For an IC where a manufacturer has specified a maximum input leakage of 10 µA, the logic low means the IC has failed the input leakage test and can be discarded. A similar conclusion can be drawn if transistor 225 is enabled and a logic high is detected. Other levels of minimum leakage current can be detected by adjusting the value of the resistive element used, as will be readily apparent to those of ordinary skill in the art.

Figure 4:
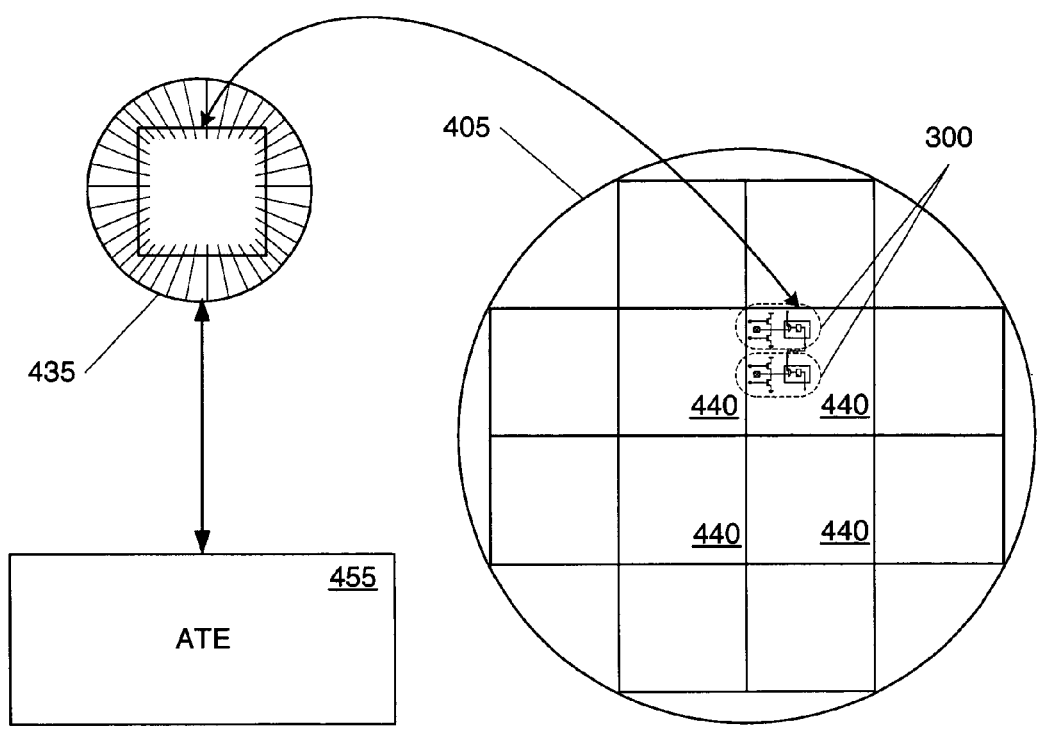
FIG. 4 illustrates a test configuration for performing an input leakage test at wafer sort, including an ATE, a probe card, and a wafer to be tested.
Figure 5:
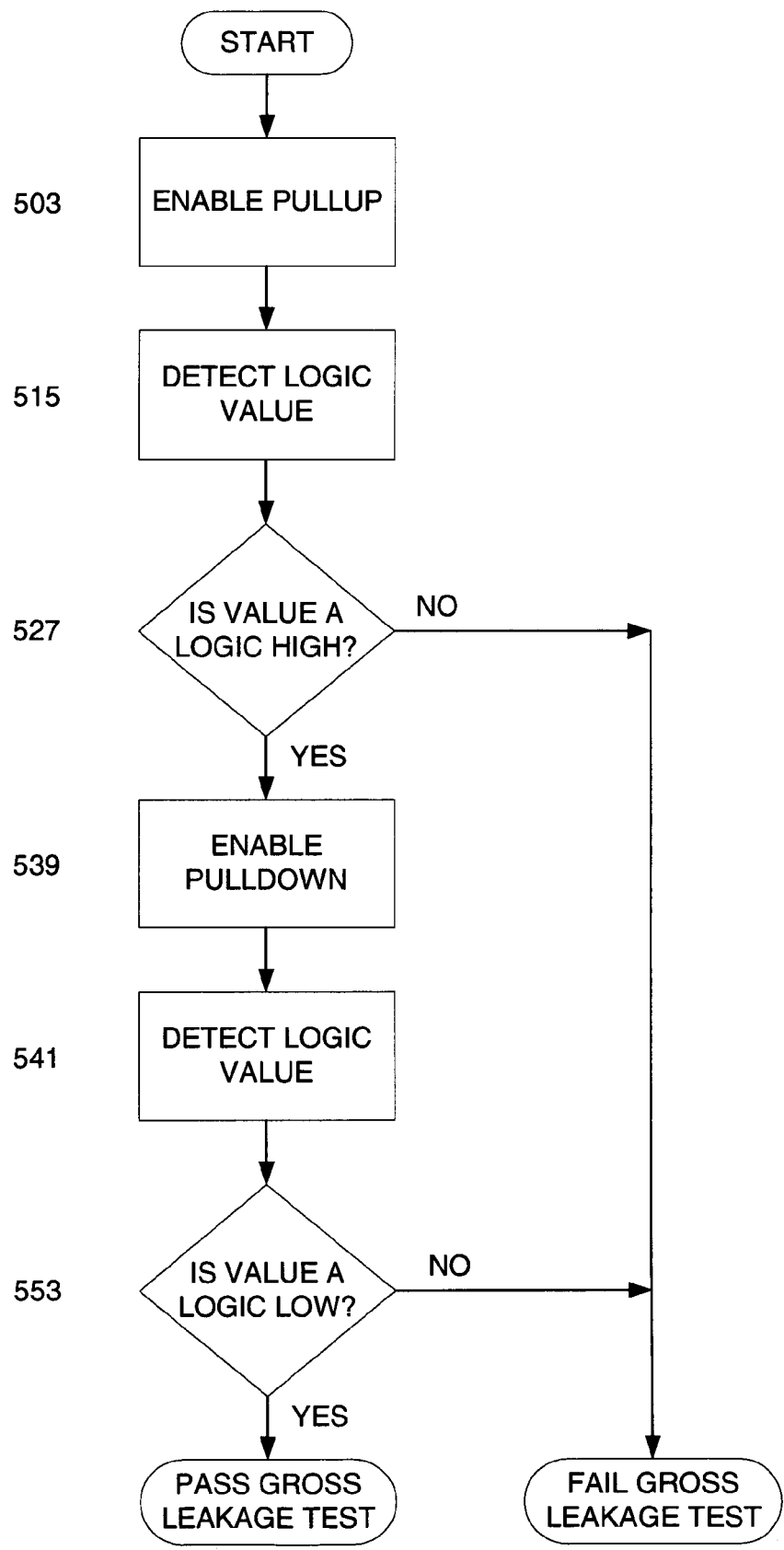
FIG. 5 is a flowchart illustrating a method for performing a gross input leakage test.

FIG. 4 illustrates a test configuration for testing input leakage of ICs at wafer sort, and the flowchart of FIG. 5 sets forth the major steps to be taken. A silicon wafer 405 with several IC "dice" 440 is shown. At wafer sort, ATE 455 is used in conjunction with a probe card 435 to step over each IC die 440 on wafer 405, and test the functionality of each IC die 440. Probe card 435 is carefully positioned over each IC die 440 on the wafer so that certain I/O pads of the IC are touched by probe card 435 and are probed and tested. As explained above, in certain applications, a manufacturer can use a probe card that does not touch down on every I/O pad, which can lead to reduced testing costs. Each IC die 440 can include one or more test circuits 300 for testing input leakage on I/O pads that probe card 435 does not touch down on. In some ICs the structure of test circuit 300 is already included and no additional circuitry is required. For example, the Virtex-II FPGA only needs to be properly configured, including configuring the I/O pads to be tested as input pads, to implement the present invention. In one embodiment, it is sufficient for probe card 435 to touch down only on JTAG control pins (e.g., TDI, TDO, TMS, TCK), and to supply power to the IC being tested, in order to test input leakage. One of the advantages of a JTAG interface for testing is that access to only a small number of pins (e.g., the JTAG control pins) is necessary to control and test the circuit. As stated previously, a reduction in the number of pads probed can mean a reduction in the cost of testing.

Referring to FIG. 5, first, (step 503) each I/O pad 121 to be tested is configured to enable pullup transistor 215. Next, (step 515) boundary scan cell 310 detects the logic value at each I/O pad 121. This value is scanned out through the serial chain and checked. In one embodiment, the value scanned out is received through probe card 435 and checked by ATE 455. If (step 527) this value is not a logic high, then the IC has failed the gross leakage test. If the value is a logic high, then (step 539) pullup transistor 215 is disabled and pulldown transistor 225 is enabled. Boundary scan cell 310 again detects the logic value at each I/O pad 121 (step 541). If (step 553) the value detected is not a logic low, then, again, the IC has failed the gross leakage test. If, however, the value is a logic low, the IC has then successfully passed the gross leakage test.

ICs that pass the gross input leakage test and other performance tests can be diced, assembled, and prepared for final test. At final test, a manufacturer can have access to all of the I/O pads and can measure the input leakage more precisely, for example by using a PMU. It is still possible that ICs that passed the gross leakage test at wafer sort may fail to meet the maximum leakage current specified by a manufacturer at final test due to this increased precision. However, since the manufacturer can eliminate the ICs that fail the gross leakage test at the wafer sort stage (and prior to assembly), the manufacturer can save the costs associated with assembly and final test for those eliminated ICs. Therefore, the present invention allows a manufacturer to perform a gross input leakage test at wafer sort, and eliminate some ICs that exceed the specified maximum leakage current. This results in a reduction in costs, and moreover, for certain ICs (such as the Virtex-II FPGA) this reduction in costs does not require any additional circuitry or additional test equipment.

Other I/O tests can also be performed in accordance with the present invention at wafer sort. A manufacturer can perform other gross functional tests at wafer sort to eliminate ICs that fail, thereby reducing the manufacturing costs. I/O characteristics can be tested to ensure that a manufacturer's performance and functionality standards are met. For example, output voltage and current can be tested at wafer sort, prior to assembly of the IC. The tests are "gross" tests in that they are designed to eliminate ICs that are clearly non-functional and well outside the performance standards set by the manufacturer. Those ICs that pass the gross test can then be diced and assembled, and then tested more fully and more precisely at final test, for example with a PMU having direct access to the I/O pads.

Figure 6:
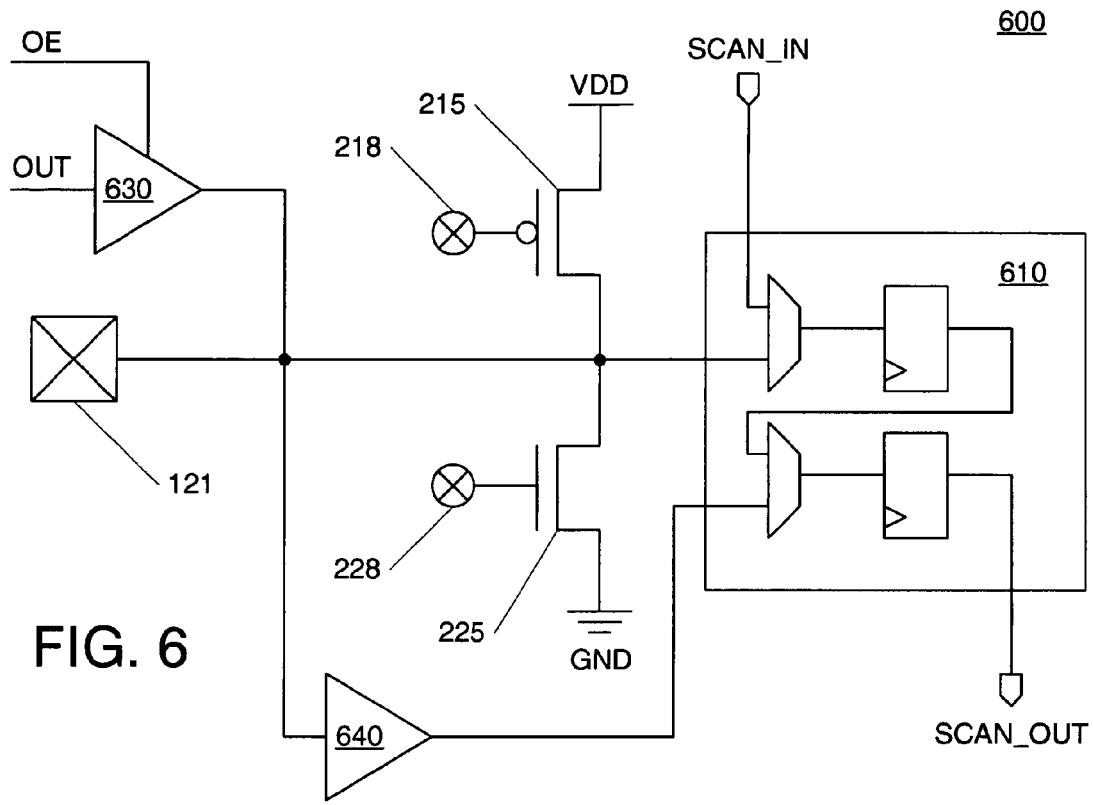
FIG. 6 shows a block diagram of a test configuration for testing gross I/O functionality an I/O pad of an IC.

FIG. 6 is a block diagram of an example of a circuit 600 for testing gross I/O functionality. Circuit 600 is similar to circuit 300, and includes a transistor 215 (coupled between I/O pad 121 and VDD) and a transistor 225 (coupled between I/O pad 121 and GND), each of which can be independently and selectively enabled by appropriately configuring memory bits 218 and 228. Transistors 215 and 225 can be used to inject current at I/O pad 121. Other elements capable of injecting a current, such as a resistor, can also be used, as is known to those of ordinary skill in the art. Circuit 600 can further comprise an input buffer 640 for receiving an input at I/O pad 121, and/or an output buffer 630. Output buffer 630 drives the output value OUT onto I/O pad 121. In some embodiments, output buffer 630 is a tristate buffer that can be disabled (or tristated) by an enable signal OE.

Circuit 600 also includes a boundary scan cell 610. Like boundary scan cell 310 of FIG. 3, boundary scan cell 610 includes storage elements that can (by, for example, using a multiplexer) store the values of particular nodes and scan those values out through a serial output SCAN_OUT. In the example shown in FIG. 6, boundary scan cell 610 can store the value at I/O pad 121, and at the output of input buffer 640. Other configurations of boundary scan cell 610 are possible and are well known to those of ordinary skill in the art. When the JTAG controller issues a SAMPLE/PRELOAD instruction, storage elements of boundary scan cell 610 can store the logical value at I/O pad 121, and at the output terminal of input buffer 640.

Figure 7:
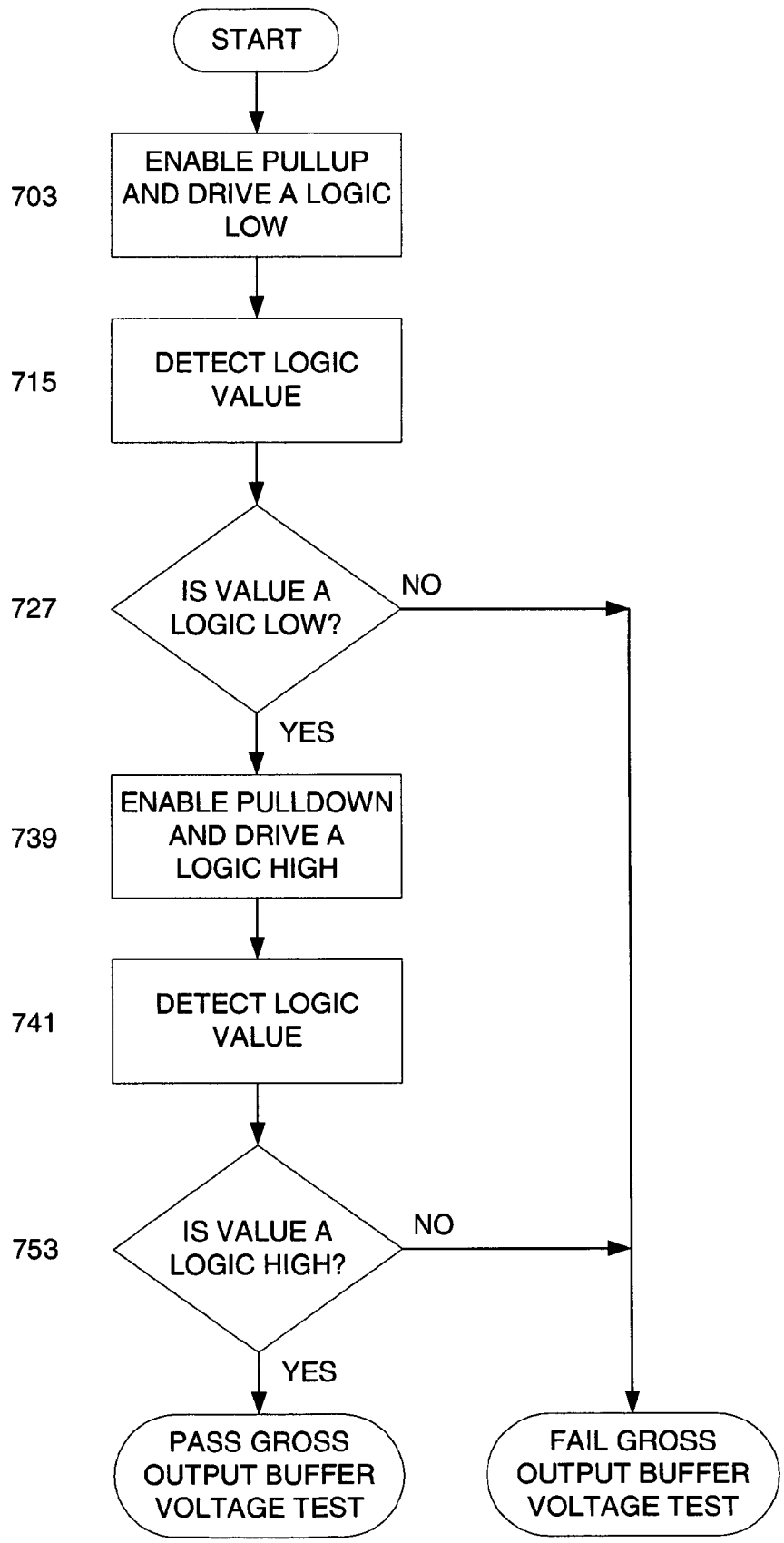
FIG. 7 is a flowchart illustrating a method for performing a gross output voltage test.

FIG. 7 shows a flowchart illustrating a method for testing output voltage at the I/O pads 121 of an IC using circuit 600 of FIG. 6. First, (step 703) each I/O pad 121 to be tested is configured to enable pullup transistor 215 (or any similar current injector), and to drive a logic low through output buffer 630. That is, buffer 630 is enabled (e.g., OE is asserted if buffer 630 is a tristate buffer) and output signal OUT is a logic low for each I/O pad. Next, (step 715) boundary scan cell 610 detects the logic value at each I/O pad 121. This value is scanned out through the serial chain and checked. As previously described with respect to FIG. 4, the value scanned out can be received through probe card 435 and checked by ATE 455.

If (step 727) the value detected and scanned out is not a logic low, then the IC has failed the gross output voltage test and can be discarded. That is, output buffer should be able to drive a logic low, even with a pullup enabled, so if a logic low is not detected by boundary scan cell 610, or any other detector, then the IC can be discarded. If, on the other hand, the value detected and scanned out is a logic low, then (step 739) pullup transistor 215 is disabled, pulldown transistor 225 (or any similar current injector) is enabled, and a logic high is driven by output buffer 630. Boundary scan cell 610 again detects the logic value (step 741). If (step 753) the value detected is not a logic high, then the IC has failed the gross leakage test and can be discarded. If, however, the value is a logic high, the IC has then successfully passed the gross leakage test.

The precision of a gross I/O characteristics test can depend on the voltage and current relationships for the current injector (e.g., transistors 215 and 225), the voltage level of the power supply VDD, and the trip point of the input to boundary scan cell 610. Other factors, such as environmental factors (e.g., temperature) or process variations can also affect precision. For example, if the trip point of the input to boundary scan cell 610 is approximately 1.5V, then if a logic high is detected when attempting to drive a logic low, the $V_{OL}$ for that IC is greater than 1.5V. In this example, if the data sheet specification for $V_{OL}$ is 0.4V, then the IC has exceeded the maximum and can be rejected and discarded. The same 1.5V trip point can also be used to test $V_{OH}$ by attempting to drive a logic high. If a logic low is detected in this case, $V_{OH}$ must be less than 1.5V, and if this is below the threshold set in the data sheet, the IC can be discarded.

In another example, the precision of an $I_{OL}$ or $I_{OH}$ measurement can be affected by the factors set forth above. For instance, if the current injectors in the I/O pads can inject a current in the range of approximately 100-200 µA, then a minimum $I_{OL}$ and $I_{OH}$ of approximately 100-200 µA can be detected by a gross test at wafer sort. A manufacturer can assert an output through an output buffer and enable a current injector. If the output buffer can sink or source at least approximately 100-200 µA, then a logic low is correctly detected when a logic low is asserted (and vice versa for a logic high). If an erroneous level is detected, the IC can be rejected. I/O pads in some ICs can have different output drive strengths, typically by selectively enabling different combinations of drive transistors in the output buffer. For example, the Virtex-II FPGA has I/O pads that can be configured with current drive strengths of 2 mA, 4 mA, 6 mA, 8 mA, 12 mA, 16 mA, and 24 mA. For such I/O pads, the output buffer can be configured for and tested at each drive strength to ensure functionality, and to verify the output buffer can source or sink at least the amount of current injected by the current injector.

Other I/O characteristics can be tested in accordance with the present invention, as will be readily apparent to those of ordinary skill in the art. For example, the functionality of the enable signal of an output tristate buffer can be verified. A manufacturer performing a test can enable and disable the output buffer in turn, and verify that the buffer is functioning properly by detecting a value through a boundary scan cell. As another example, an input buffer can be tested by asserting a value at an I/O pad and then verifying that the output of the input buffer matches that asserted value. As described above, many ICs, including the Virtex-II FPGA, already include the circuitry and resources to perform such tests, and therefore the methods described herein can be implemented without any additional circuitry or resources. Furthermore, even for ICs that lack all of the necessary resources, the necessary elements can typically be added with minimal circuitry at a low cost.

Figure 8:
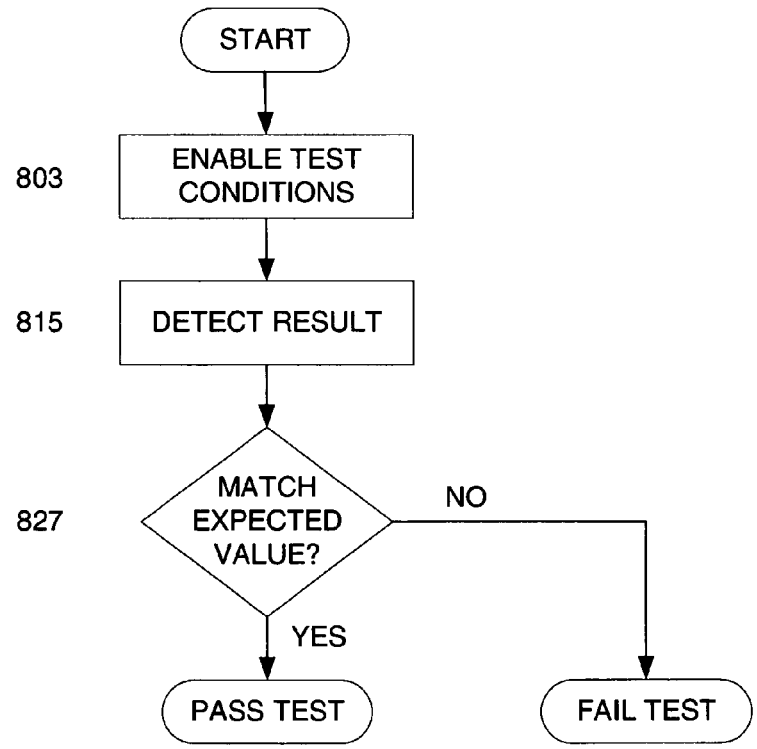
FIG. 8 is a flowchart illustrating a method for performing a gross functional voltage test.

FIG. 8 shows a flowchart illustrating a general method for testing the I/O pads of an IC using a test configuration in accordance with the present invention. First (step 803), test conditions are enabled. This can involve enabling or disabling current injectors, and enabling or disabling input and output buffers of the I/O pad, depending on the type of test to be performed. The precision of the test can be varied depending on the specific combination of test conditions imposed. Then (step 815), a test result is detected by a detector. The test result is compared to an expected value (step 827), and if the detected test result does not match the expected value, the I/O pad has failed the test and IC can be discarded. If the test result and the expected value do match, then the I/O pad has passed that test. This procedure can be repeated for other tests.

Those having ordinary skill in the relevant arts of the invention will now perceive various modifications and additions that can be made as a result of the disclosure herein. For example, changes can be made in test conditions in order to vary the precision of the measurements. For another example, the methods of the present invention can be performed in hardware, software, or any combination thereof, as those terms are currently known in the art. Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of ordinary skill in the art.

Accordingly, all such modifications and additions are deemed to be within the scope of the invention, which is to be limited only by the appended claims and their equivalents.

What is claimed is:

1. A test configuration comprising:
an integrated circuit to be tested;
an I/O pad of the integrated circuit;
an output buffer, wherein an output terminal of the output buffer is coupled to the I/O pad;
a current injector on the integrated circuit coupled to the I/O pad, wherein the current injector injects a current at the I/O pad; and
a detector on the integrated circuit coupled to the I/O pad, wherein the detector detects a logic level of the I/O pad.

2. The test configuration of claim 1 wherein the output buffer is a tristate buffer.

3. The test configuration of claim 1 further comprising an input buffer, wherein an input terminal of the input buffer is coupled to the I/O pad.

4. The test configuration of claim 1 wherein the current injector is selectively enabled by a memory bit.

5. The test configuration of claim 1 wherein the current injector is a resistive element on the integrated circuit coupled between the I/O pad and a voltage reference node.

6. The test configuration of claim 5 wherein the resistive element is a transistor.

7. The test configuration of claim 6 wherein a gate of the transistor is coupled to a memory bit.

8. The test configuration of claim 5 wherein the voltage reference node is a power node.

9. The test configuration of claim 5 wherein the voltage reference node is a ground node.

10. The test configuration of claim 1 wherein the integrated circuit is one of a plurality of integrated circuits on a wafer.

11. The test configuration of claim 1 wherein the integrated circuit comprises a plurality of I/O pads, the test configuration further comprising:
a probe card coupled to a subset of the plurality of I/O pads; and
automated test equipment coupled to the probe card.

12. The test configuration of claim 1 wherein the integrated circuit is a programmable logic device.

13. The test configuration of claim 1 wherein the detector is a boundary scan cell.

14. The test configuration of claim 1 wherein the logic level detected by the detector indicates whether the output buffer meets a voltage specification of the output buffer.

15. A test configuration comprising:
an integrated circuit to be tested;
an I/O pad of the integrated circuit;
a current injector on the integrated circuit coupled to the I/O pad for injecting a current at the I/O pad;
wherein the current injector is a first transistor coupled between the I/O pad and a power node;
a detector on the integrated circuit coupled to the I/O pad for detecting a logic level of the I/O pad
a second transistor coupled between the I/O pad and a ground node;
a first memory bit coupled to a gate of the first transistor; and
a second memory bit coupled to a gate of the second transistor.

16. The test configuration of claim 15 further comprising:
a tristate output buffer having an output terminal coupled to the I/O pad; and
an input buffer having an input terminal coupled to the I/O pad.

17. A method for testing an I/O pad of an integrated circuit, the method comprising:
enabling a current injector on the integrated circuit coupled to the I/O pad, wherein the current injector injects a current at the I/O pad;
driving an output value at the I/O pad through an output buffer coupled to the I/O pad;
enabling a detector on the integrated circuit coupled to the I/O pad; and
after enabling the detector, detecting a logic value of the I/O pad.

18. The method of claim 17 further comprising:
comparing the detected logic value with an expected value; and
if the detected logic value and the expected value do not match, rejecting the integrated circuit.

19. The method of claim 17 wherein the output value is a logic low, further comprising:
if the detected logic value is not a logic low, rejecting the integrated circuit.

20. The method of claim 19 wherein the output value is a first output value and wherein the detected logic value is a first detected logic value, further comprising:
driving a second output value at the I/O pad through the output buffer, wherein the second output value is a logic high;
detecting a second logic value of the I/O pad; and
if the second detected logic value is not a logic high, rejecting the integrated circuit.

21. The method of claim 20 wherein the step of rejecting the integrated circuit comprises discarding the integrated circuit after the integrated circuit is diced from a wafer.

22. The method of claim 17 further comprising:
receiving an input value through an input buffer coupled to the I/O pad.

23. The method of claim 17 further comprising:
storing the detected logic value in a boundary scan cell of the integrated circuit;
scanning out the stored logic value.

24. The method of claim 23 further comprising:
receiving the scanned logic value through a probe card; and
analyzing the received logic value with automated test equipment at wafer sort.

25. The method of claim 24 further comprising stepping the probe card over each of a plurality of integrated circuits on a wafer.

26. The method of claim 17 further comprising determining whether the output buffer passes a gross output buffer voltage test.

* * * * *